United States Patent [19]
Lee et al.

[11] Patent Number: 6,008,676
[45] Date of Patent: Dec. 28, 1999

[54] DIGITAL CLOCK FREQUENCY MULTIPLIER

[75] Inventors: Eng Han Lee; Yung Yum Ang, both of Singapore, Singapore

[73] Assignee: Tritech Microelectronics, Ltd., Singapore, Singapore

[21] Appl. No.: 09/031,547

[22] Filed: Feb. 27, 1998

[51] Int. Cl.$^6$ ................................................. H03B 19/00
[52] U.S. Cl. ........................... 327/122; 327/116; 327/119; 327/284
[58] Field of Search ................................... 327/116, 119, 327/122, 113, 284; 377/47

[56] References Cited

U.S. PATENT DOCUMENTS

| | | | |
|---|---|---|---|
| 4,600,895 | 7/1986 | Landsman | 331/1 A |
| 4,799,022 | 1/1989 | Skierszkan | 327/116 |
| 5,530,387 | 6/1996 | Kim | 327/119 |

*Primary Examiner*—Kenneth B. Wells
*Assistant Examiner*—Maria Hasanzaduh
*Attorney, Agent, or Firm*—George O. Saile; Stephen B. Ackerman

[57] ABSTRACT

This invention describes a circuit and method for creating a double clock frequency. The circuit uses a sequence of delay elements to delay the primary clock. A delay detector determines when a delayed clock is out of phase with the primary clock. A delay is selected that is one half the delay producing the out of phase delayed clock. The selected delay is used to combine with the primary clock to produce a double clock frequency. Control signals for selecting the "half" delayed clock are latched to prevent clock jitter and spurious signal from producing error signals in the double frequency clock. Different duty cycles can be established by varying the selected delay.

11 Claims, 7 Drawing Sheets

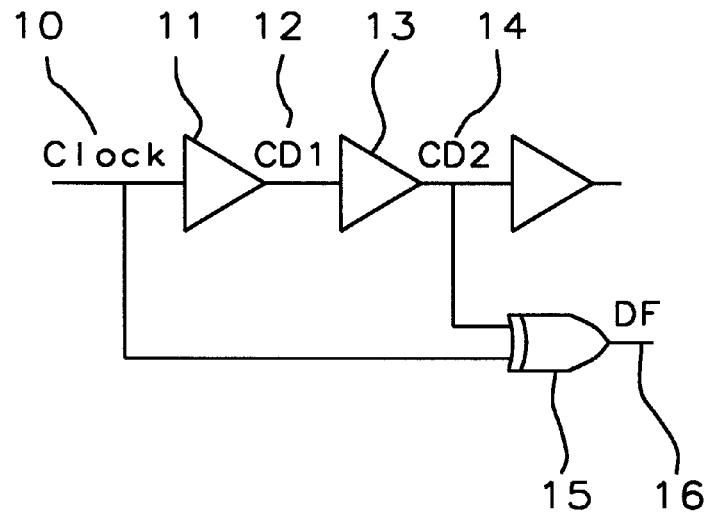
*FIG. 1a - Prior Art*
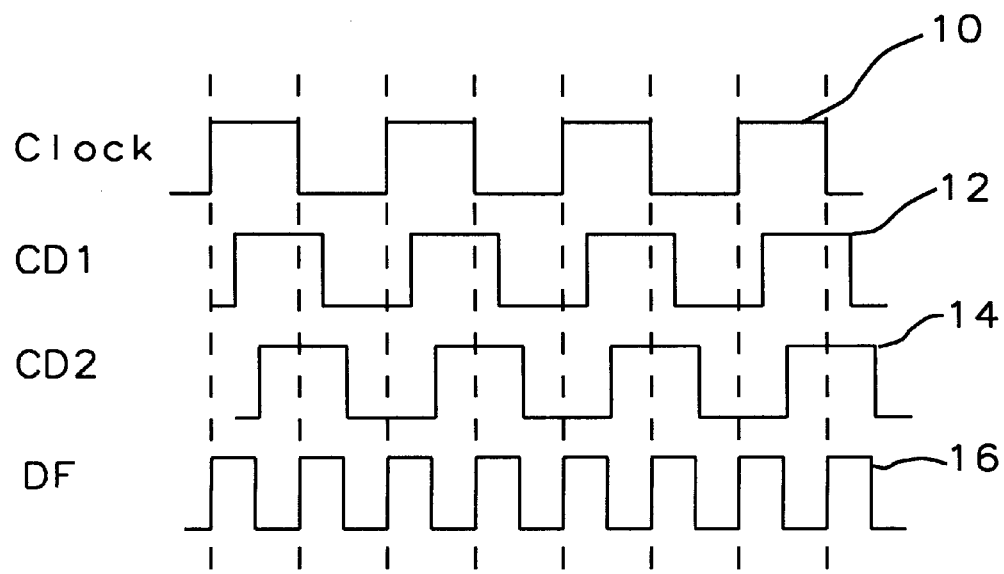
*FIG. 1b - Prior Art*

DIGITAL CLOCK FREQUENCY MULTIPLIER

BACKGROUND OF THE INVENTION

1. Field of Invention

This invention relates to integrated circuits, and in particular multiplying clock frequencies using digital techniques.

2. Description of Related Art

Most clock frequency multipliers use a phase locked loop (PLL) when a tightly controlled clock is required, or a simple delay chain when the clock is not critical. The PLL provides a stable and tightly controlled output, but is an analog circuit requiring an analog fabrication process using a large area on a chip. The PLL also has a tendency to dissipate a lot of power. Simple delay chains that can be implemented in digital logic and use relatively low power are prone to variations in period and frequency as a result of manufacturing process, or different operating environments, and are not suitable for timing critical designs.

In U.S. Pat. No. 4,339,722 (Sydor et al.) a digital frequency multiplier is described using counters where the number of internal clocks are counted within the period of an incoming signal and compared to the number of clocks counted in a second counter having N times the clock rate of the first counter. For this scheme to work an internal clock generator must be N times the clock driving the counter receiving the input signal which in turn must be faster than the incoming signal.

In U.S. Pat. No. 5,321,734 (Ogata) a frequency multiplier circuit is described where the output signal is blocked. The blocking occurs when the delay relationship of the output clock of double frequency is too far askew with respect to the master clock.

In U.S. Pat. No. 5,436,939 (Co et al.) a multiphase clock generator is described using a phase locked loop and having the capability of providing a multiple of clock signals shifted in phase from one another. These phase shifted waveforms are then combined to produce an output clock signal which is a frequency double of the input clock.

Referring to U.S. Pat. No. 5,530,387 (Kim), a frequency doubler circuit is described using delay circuits, a detector and a decoder to determine where in time a midpoint of a reference clock pulse occurs. This allows a clock signal of double frequency to be created at a particular duty cycle and controlled to be within an acceptable tolerance for different variations of process and environment. However, this circuit is not free of glitches caused by clock jitter.

In timing critical situations it is important to have a stable clock and to have all derivatives of that clock, such as double frequency clocks, to be stable throughout variations in the semiconductor process that created the circuitry and the environment that contains the circuitry. One way to produce a double frequency clock that maintains its relationship to a master clock is to create a design that adjusts the double frequency clock to be within an allowed phase relationship to the master clock. By continuously monitoring and adjusting when necessary, clocks of different frequencies can maintain a tight relationship that permits critical logic to operate.

SUMMARY OF THE INVENTION

In this invention a primary clock signal requiring frequency doubling is connected to a delay circuit containing a plurality of delay elements sequentially connected. Distributed along the delay elements are a set of latches that are used as delay detectors. The output of each delay element is connected to the clock input of a latch. The primary clock signal is connected to the data input to each latch. Thus the various latches detect the primary clock signal at different delays. When the primary clock signal and the delayed clock are in phase or nearly in phase, the corresponding latch connected to the delay element in the sequence of delay elements will capture the logical one of the primary clock signal. When through further delay elements the delayed clock becomes out of phase with the primary clock signal, the corresponding latch will capture the logical zero of the primary clock signal (absence of the clock pulse). Latches connected to subsequent delay elements will exhibit a logical zero until enough delay elements, if they exist, allow the two clock signal to again be in phase. The first detection of a logical zero is a delay point where the delayed clock is out of phase, or nearly out of phase, with the primary clock.

The output of the latches are connected to a decoder. The decoder determines which latch output produces the first logical zero. This is where the delayed clock and primary clock are out of phase with each other. The decoder chooses one half of the delay of the delayed clock producing the out of phase condition and connects to a multiplexer through a set of latches the location information of the delay element producing the one half delay of the out of phase condition. The latches at the output of the decoder are clocked by a clock that is out of phase with the primary clock, and the latches prevent spurious signals from clock jitter, or other disturbances, from propagating to the multiplexer.

The delayed clock from each delay element in the sequence of delay elements is connected to a set of exclusive OR circuits. The outputs of the exclusive OR circuits are connected to the multiplexer. Connected to the input of each exclusive OR circuit is one of the delayed clocks and the primary clock. The exclusive OR circuits produce outputs having a frequency of double the primary clock frequency with varying degrees of duty cycle. The decoder output, connected to the multiplexer through the set of latches, selects the output of the exclusive OR the produces the double clock frequency at a fifty percent duty cycle and connects this double frequency signal to the output of the multiplexer. The delayed clock connected to the input of the exclusive OR circuit selected by the output of the decoder has a delay that is half that of the delayed clock producing the first the first zero at the output of the latches. Other duty cycles of the double clock frequency can be obtained by choosing a different fraction of the out of phase delay between the primary clock and the delayed clock.

BRIEF DESCRIPTION OF THE DRAWINGS

This invention will be described with reference to the accompanying drawings, wherein:

FIG. 1a is a schematic diagram of prior art;

FIG. 1b is a signal waveform diagram of prior art;

DETAILED DESCRIPTION OF THE PREFERRED EMBODIMENT

Figure 2A:
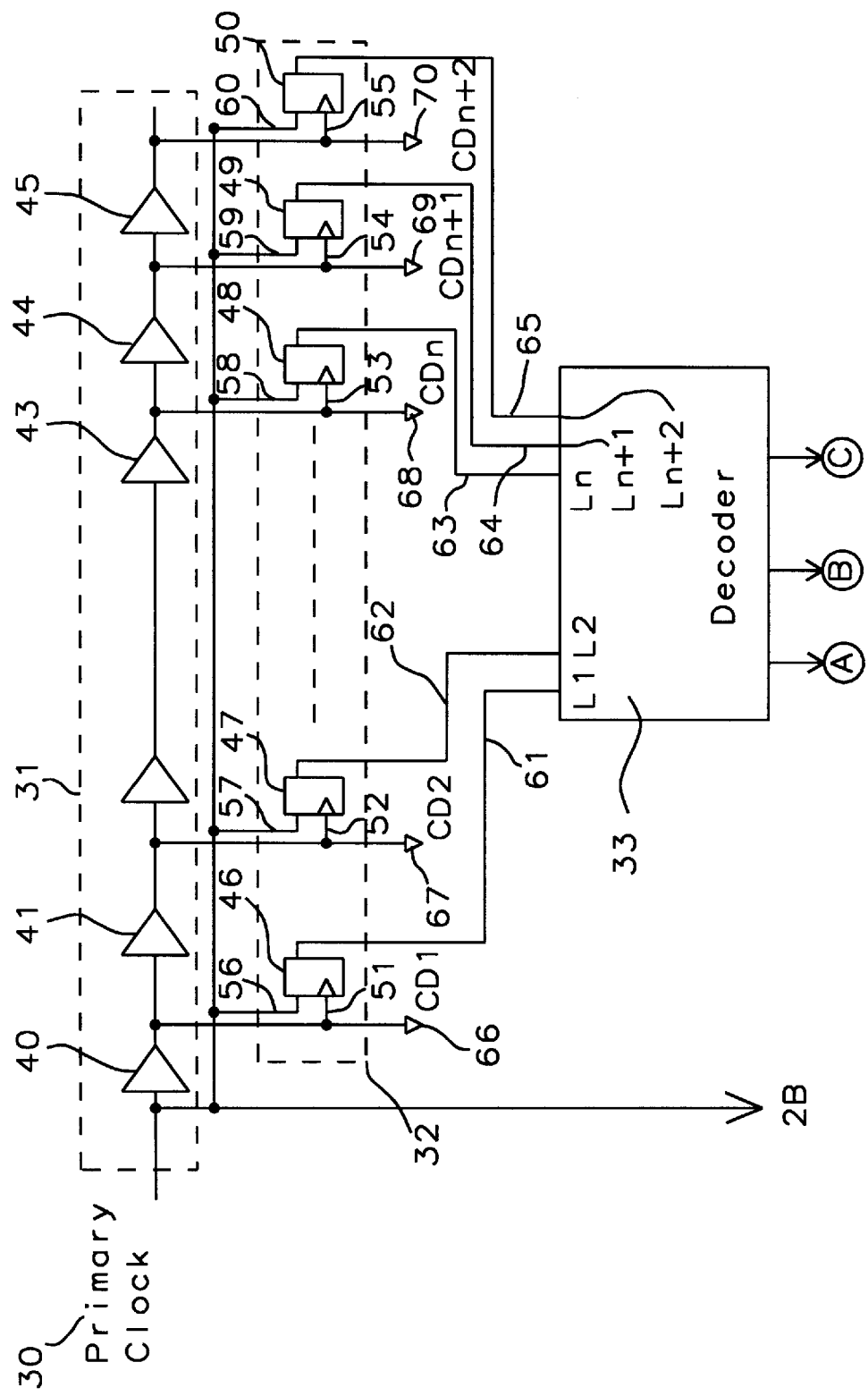
FIGS. 2A and 2B are schematic diagrams of the preferred implementation of the invention.

In FIG. 1a is shown a prior art schematic for doubling the frequency of a clock 10 which is connected to the input of a first delay circuit. The output of the first delay circuit CD1 12 is connected to a second delay circuit 13 whose output CD2 14 is connected to an input of an XOR circuit 15. Also connected to the XOR circuit 15 is the clock 10. The XOR circuit 15 combines the clock 10 and CD2 14 to produce an output DF 16 having double the frequency of the clock 19.

In FIG. 1b is shown the waveforms at various points in the circuit shown in FIG. 1a. The double frequency signal DF 16 at the output of the XOR circuit is a function of the timing of the second delayed clock CD2 14 and the clock 10. As can be seen from FIG. 1b, the clock 10 and the second delayed clock CD2 14 have a fifty percent duty cycle with a twenty five percent overlap producing a symmetrical double frequency signal 16 at the output of the XOR circuit.

Whereas, the circuit shown in FIG. 1a with waveforms shown in FIG. 1b satisfies the need for a frequency doubler, the circuit does not satisfy the need to have a stable double frequency 16 in which the duty cycle is critically controlled. Both semiconductor process variations and changes in the environment provide opportunity to vary the duty cycle of the double frequency signal 16.

Figure 2B:
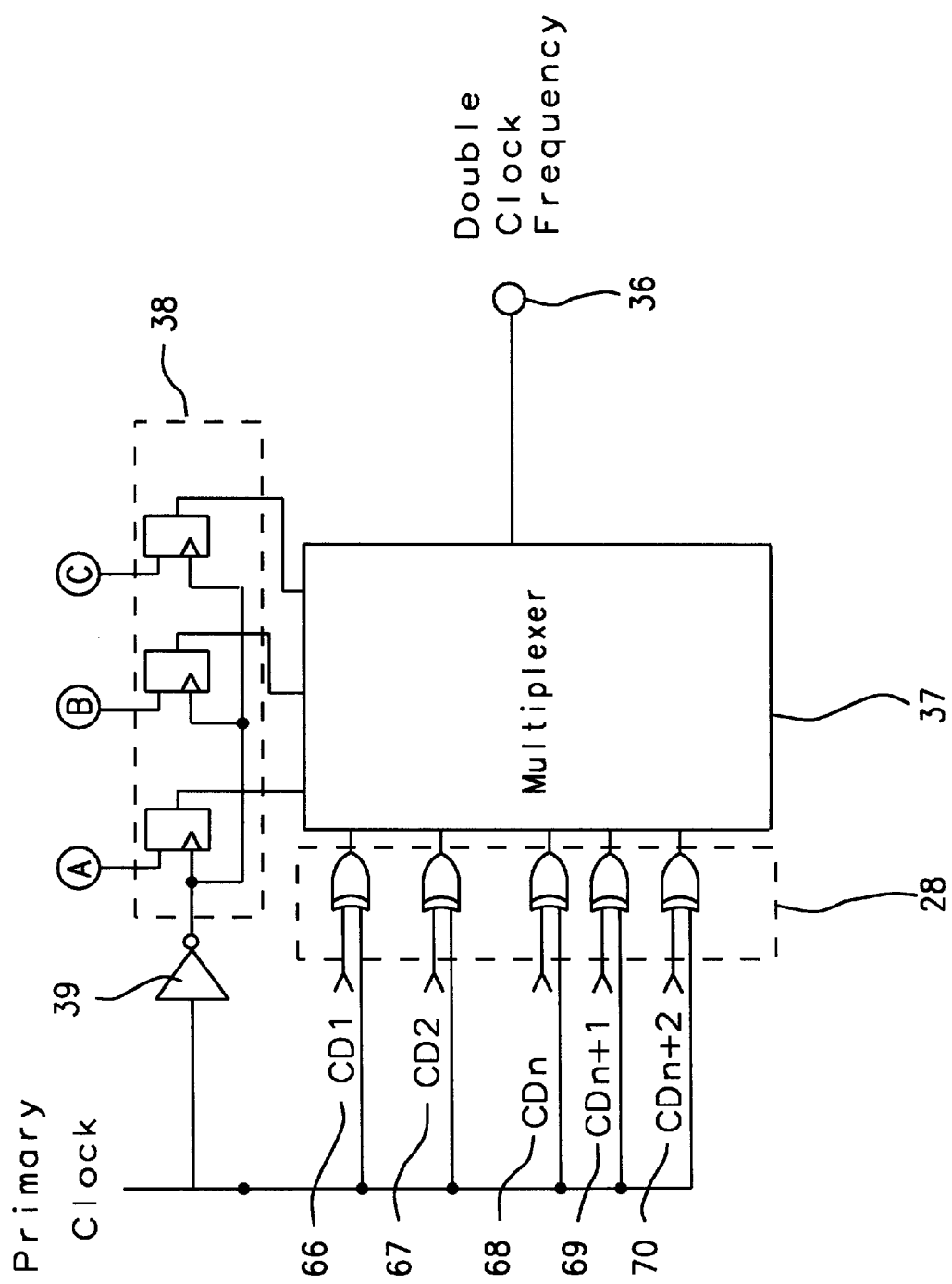

In FIGS. 2A and 2B is shown the schematic of a frequency doubling circuit in which a delayed clock 31 is detected by a set of latches 32 used as delay detectors. The detected delays 61 62 63 64 65 are connected to a decoder which chooses a delay 66 67 68 69 70 that is one half the delay that produces an out of phase signal with the primary clock 30. The output of the decoder 33 is connected to a multiplexer 37 through a set of latches 38, and the decoder output controls the multiplexer 37 to select the output of an exclusive OR (XOR) 28 that is connected to the half delay of that producing an out of phase signal with the primary clock 30. This produces a doubled clock frequency at the multiplexer output 36 having a duty cycle of approximately fifty percent.

Continuing to refer to FIGS. 2A and 2B, the delay detector 32 is made of individual latches 46, 47, 48, 49, 50. The output 66 (CD1) of the first delay element 40 is connected to an XOR circuit 28 and to the clock input 51 of latch 46. The output 67 (CD2) of the next delay element 41 is connected to an XOR circuit 28 and to the clock input 52 of latch 47. The output 68 (CDn) of the "nth" delay element 43 is connected to an XOR circuit 28 and to the clock input 53 of latch 48. The output 69 (CDn+1) of the "n+1" delay element 44 is connected to an XOR circuit 28 and to the clock input 54 of latch 49. The output 70 (CDn+2) of the "n+2" delay element 45 is connected to an XOR circuit 28 and to the clock input 55 of latch 50. Connected to the inputs of the XOR circuits 28 is the primary clock 30.

Continuing to refer to FIGS. 2A and 2B, the output 61 of the latch 46 is connected to the decoder 33 and is designated "L1". The output 62 of the latch 47 is connected to the decoder 33 and is designated "L2". The output 63 of the latch 48 is connected to the decoder 33 and is designated "Ln". The output 64 of the latch 48 is connected to the decoder 33 and is designated "Ln+1". The output 65 of the latch 50 is connected to the decoder 33 and is designated "Ln+2". The digital signals connected to the decoder 33 and designated as "L1", "L2", "Ln", "Ln+1" and "Ln+2" are used to detect the out of phase delay with respect to the primary clock 30 and select the delay that is half the delay of the out of phase delay. The delay location of "half the delay" is latched into a set of latches 38 to prevent spurious signals from propagating to the output of the multiplexer 36 and producing possible glitches. The set of latches 38 are clocked through an inverter 39 driven by the primary clock 30.

Continuing to refer to FIGS. 2A and 2B, the outputs the set of XOR circuits 28 are connected to the input of the multiplexer 37. The inputs of the XOR circuits 28 are connected to the primary clock 30 and a delayed clock designated as "CD1", "CD2", . . . , "CDn", "CDn+1" and "CDn+2" 66 67 68 69 70. The output of the XOR circuits 28 are signals with double the primary clock frequency 30 at varying duty cycles. The latched output 38 of the decoder 33 controls the multiplexer 37 to connect the output signal of the XOR circuits 28 to the output of the multiplexer 36 that has double the primary clock frequency at a fifty percent duty cycle.

Figure 3A:
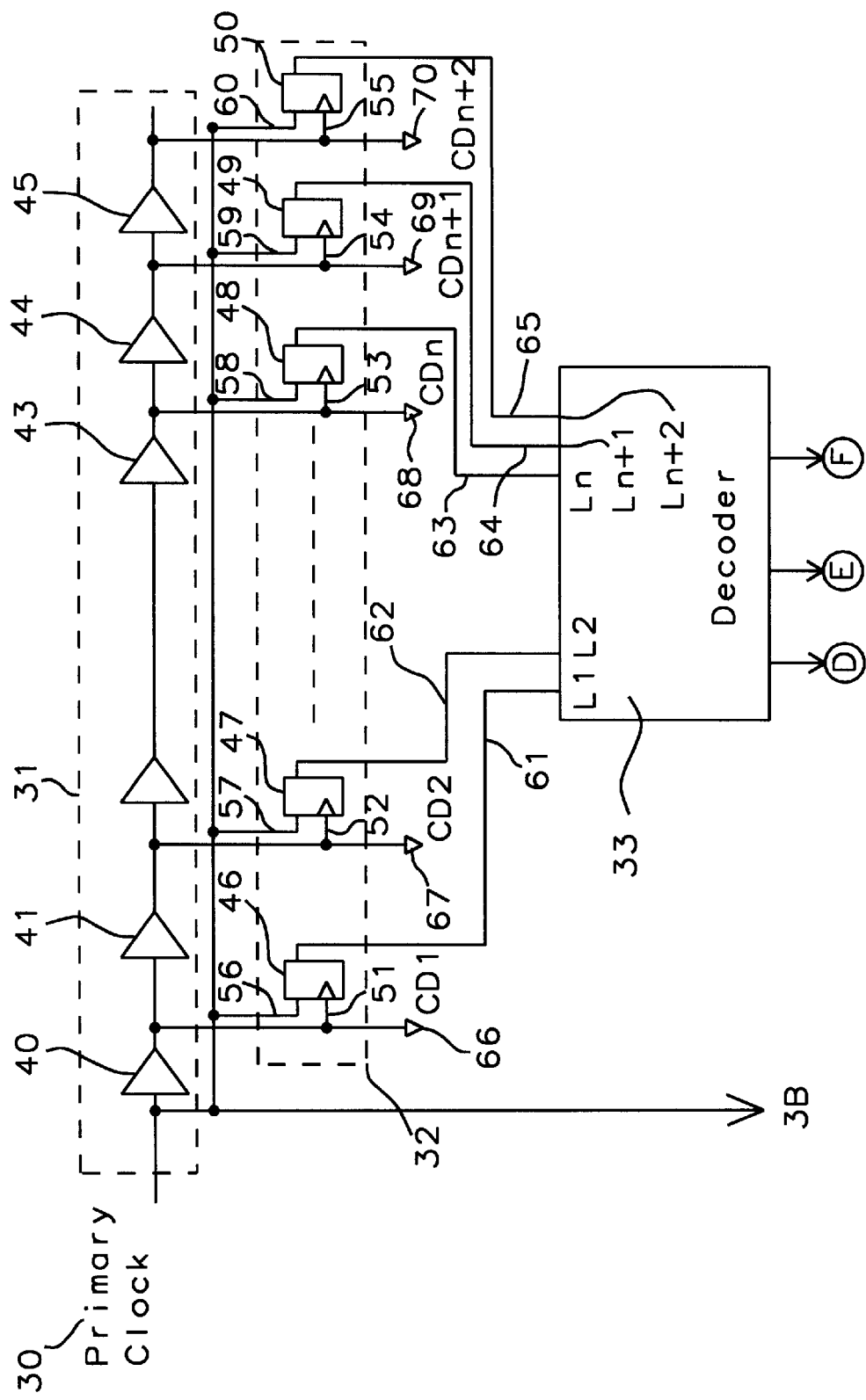
FIGS. 3A and 3B are schematics of an alternate implementation of the invention.
Figure 3B:
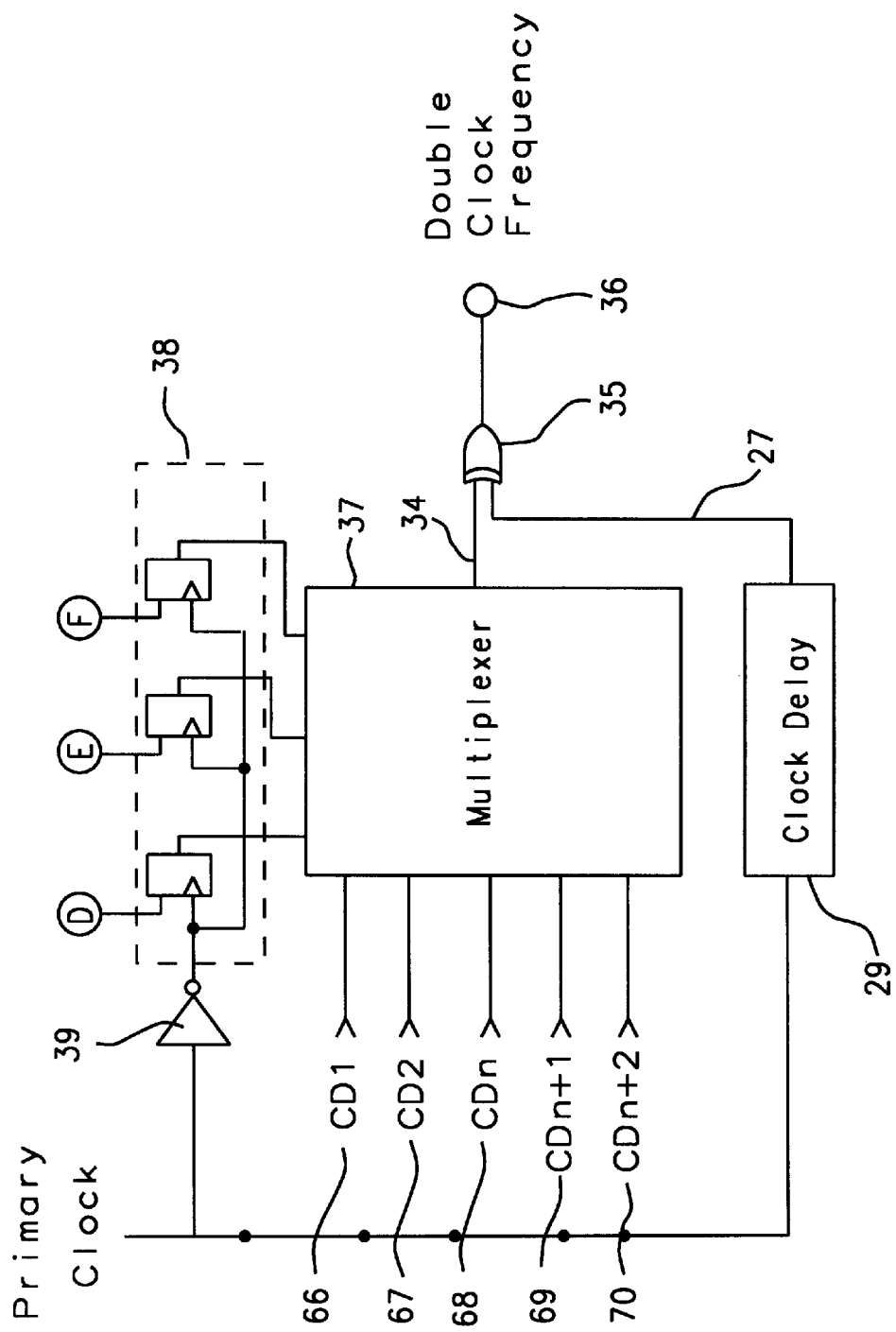

In FIGS. 3A and 3B is shown the schematic of a frequency doubling circuit in which a selected delayed clock 34 from the output of the multiplexer is combined in the XOR circuit 35 with a delayed primary clock 27 to produce a double clock frequency 36 with a fifty percent duty cycle. The clock delay 29 in the primary clock 30 connection to the XOR 35 is to compensate for the delay through the multiplexer 37 of delayed clocks "CD1", "CD2", . . . , "CDn", "CDn+1" and "CDn+2" 66 67 68 69 70 and to allow a fifty percent duty cycle in the doubled frequency clock. The selection of the delayed clocks "CD1", "CD2", . . . , "CDn", "CDn+1" and "CDn+2" 66 67 68 69 70 in the multiplexer 37 is controlled by the output of the decoder 33 that is latched into a set of latches 38. The latches 38 are clocked through an inverter 39 and prevent spurious signals from propagating through to the multiplexer 37 that could cause possible perturbations.

Continuing to refer to FIGS. 3A and 3B, the primary clock 30 is delayed in a delay circuit 31 constructed of a plurality of delay elements 40, 41, 43, 44, 45 sequentially connected and forming a sequential chain of delay elements. Distributed along the delay circuit 31 and connected to the output of each delay element is a delay detector 32. The delay detector consists of a set of latches 46 47 48 49 50. The output 61, 62, 63, 64, 65 of the delay detector 32 is connected to the decoder 33. The decoder determines which output of the delay circuit 31 is out of phase with the primary clock 30 by determining which output of the delay detector 32 produces the first logical "0". The decoder then selects a delay clock 31 that has half the delay value of that producing the out of phase condition and connects the location of the half delay to the latches 38 at the output of the decoder 33.

Continuing to refer to FIGS. 3A and 3B, the output 61 of the latch 46 is connected to the decoder 33 and is designated "L1". The output 62 of the latch 47 is connected to the decoder 33 and is designated "L2". The output 63 of the latch 48 is connected to the decoder 33 and is designated "Ln". The output 64 of the latch 48 is connected to the decoder 33 and is designated "Ln+1". The output 65 of the latch 50 is connected to the decoder 33 and is designated "Ln+2". The digital signals connected to the decoder 33 are designated as "L1", "L2", . . . , "Ln", "Ln+1" and "Ln+2" 61 62 63 64 65. The digital decoder determines which output of the delay circuit is out of phase with the primary clock and produces the first logical zero in the latches 46 47 48 49 50. The decoder 33 then determines which delayed clock designated as "CD1", "CD2", . . . , "CDn", "CDn+1" and "CDn+2" 66 67 68 69 70 has a delay that is one half of the delay that produced the first logical zero. This delay that is one half of the delay that produced the first logical zero is a quarter phase shift of the primary clock 30. The location of this "one half" delay is latched into the latches 38 at the output of the decoder 33. The latches 38 are clocked from the primary clock 30 through an inverter 39 to prevent unwanted signals caused by clock jitter and noise from disturbing the double clock frequency 36. The location data contained in the latches 38 is connected to the multiplexer 37 and is used to select the quarter phase shifted clock from the delayed clocks "CD1", "CD2", . . . , "CDn", "CDn+1" and "CDn+2" 66 67 68 69 70 connected to the input of the multiplexer 37. The quarter phase shifted clock is connected through to the output of the multiplexer 34 where it is connected to an XOR with a delayed primary clock 27. The output of the XOR circuit 35 is a double clock frequency with a fifty percent duty cycle. The clock delay 29 is a delay that matches any added delay of the clock signals "CD1", "CD2", . . . , "CDn", "CDn+1" and "CDn+2" 66 67 68 69 70 through the multiplexer 37 in order to produce the required duty cycle of the doubled clock frequency 36. Other means for compensating for the added delay of the multiplexer 37 could be done in the decoder 33 so that a slightly earlier delayed clock is chosen and its location latched into the output latches 38 of the decoder 33.

Figure 4:
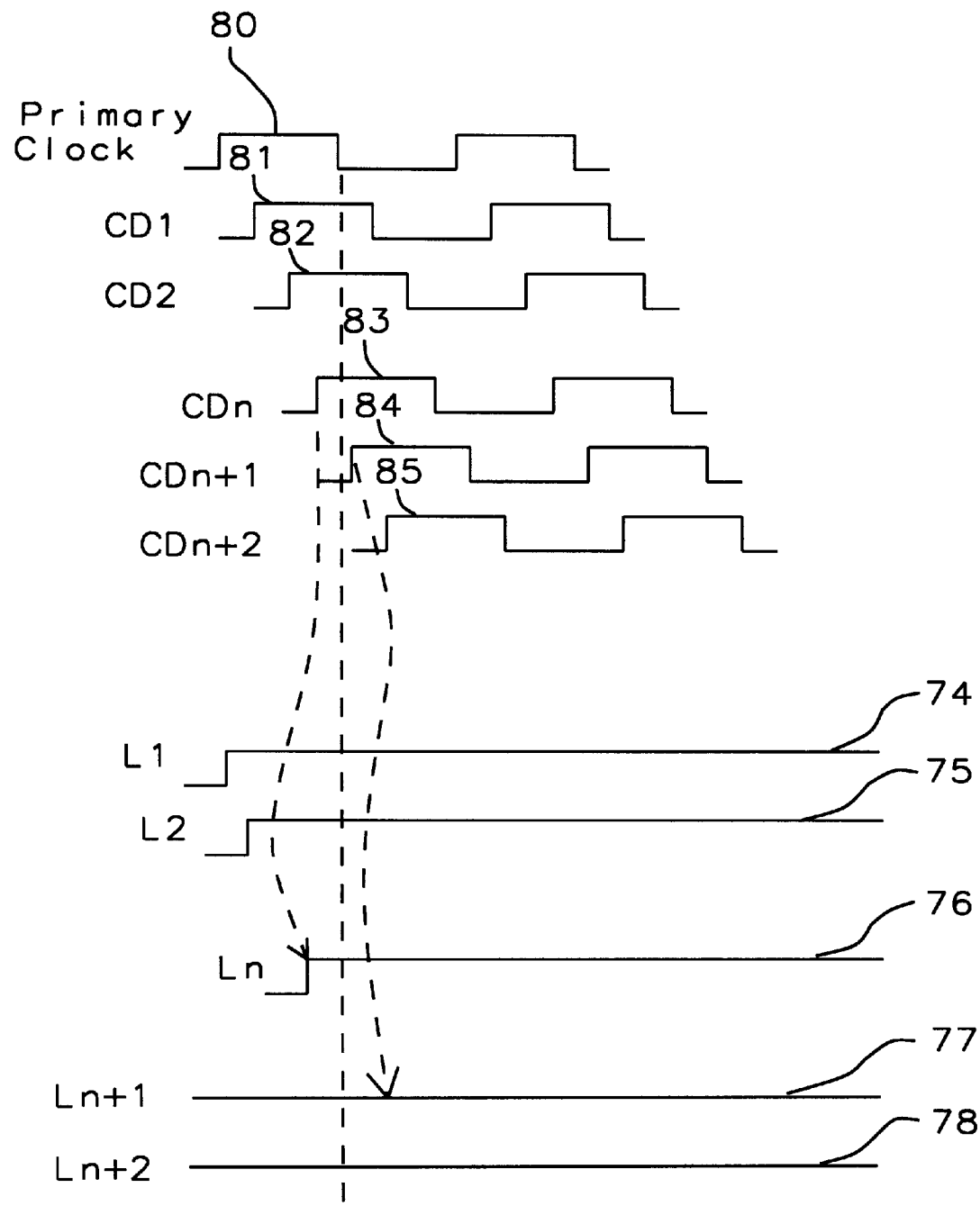
FIG. 4 is a diagram of signal waveforms of the invention.

Shown in FIG. 4 are waveforms that demonstrate how the delay detector 32 shown in FIGS. 2A, 2B and FIGS. 3A, 3B detects a delayed signal that is out of phase with the primary clock.. The primary clock signal 80 in FIG. 4 is the data input to the latches 46 47 48 49 50 of FIGS. 2A, 2B and FIG. 3A, 3B. The delayed clock signals 81 82 83 84 85 designated as "CD 1", "CD2", . . . , "CDn", "CDn+1" and "CDn+2" are the clock input to the latches 46 47 48 49 50 shown in FIG. 2 and FIG. 3. The output signals of the latches 46 47 48 49 50 are shown in FIG. 4 designated as "L1", "L2", . . . , "Ln", "Ln+1", and "Ln+2" 74 75 76 77 78. When the delayed clocks "CD1", "CD2", . . . , "CDn" 81 82 83 are less than one half of a primary clock cycle 80, the output of the latches "L1", "L2", . . . , "Ln" 74 75 76 are a logical one. When the next delayed clock signal "CDn+1" 84 goes beyond the falling edge of the primary clock signal 80, then the output signal of the latch "Ln+1" 77 produces the first a logical zero and the clock delay signal "CDn+1" 84 is defined to be out of phase with the primary clock signal 80. Subsequent delayed clock signals like "CDn+2" 85 will continue to produce a logical zero at the output of the latches until enough clock delay, if available, brings the delayed clock signal and the primary clock back into phase. When a clock delay that is one half that which produces the first zero is chosen by the decoder, the resulting clock delay is a one quarter phase shift from the primary clock. This allows a double clock frequency to be produced at a fifty percent duty cycle similar to the waveform DF 16 shown in FIG. 1b but without the susceptibility to drift, spurious signals and glitches.

Figure 5:
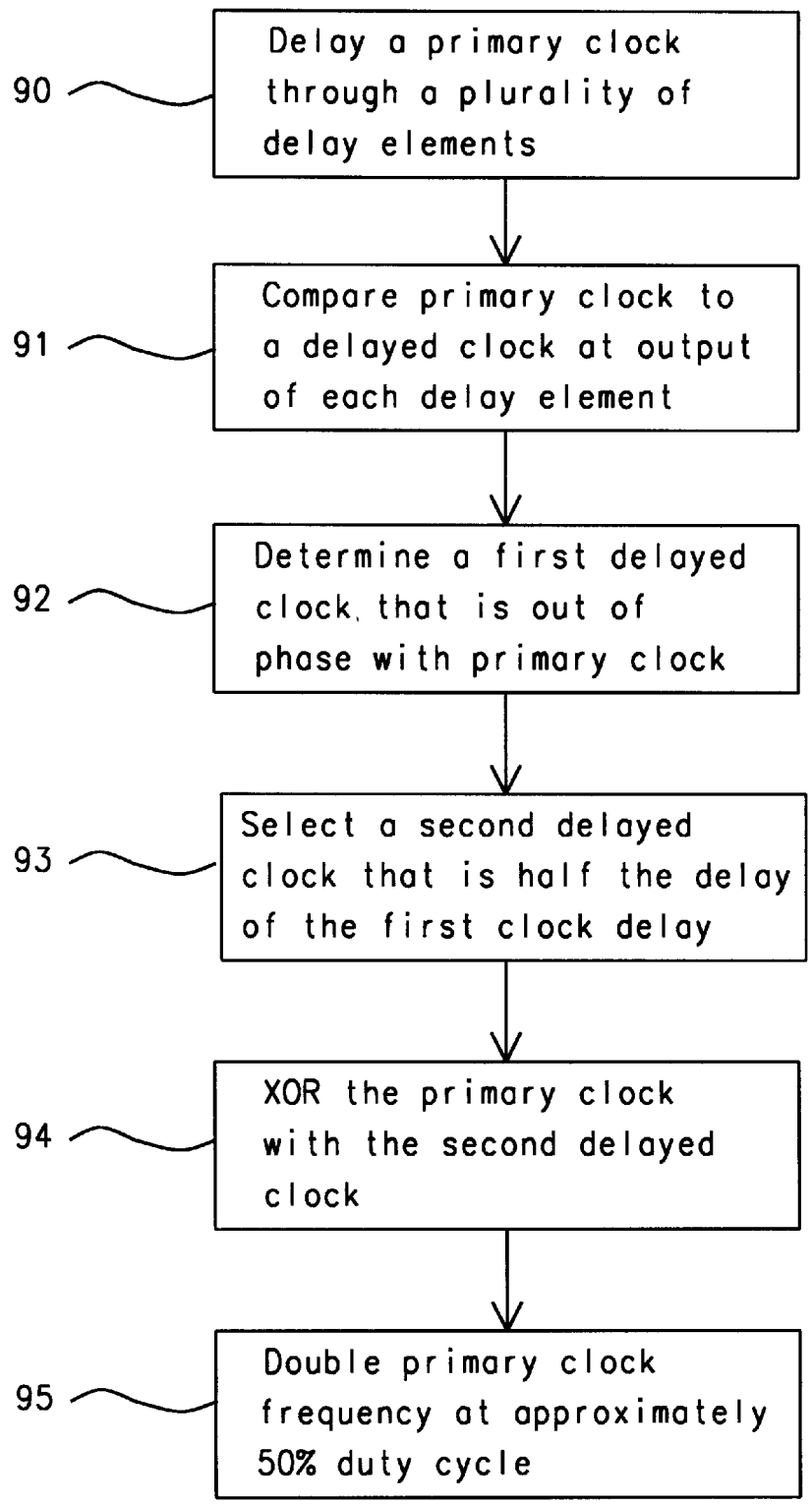
FIG. 5 is flow diagram of the method of creating multiple frequencies.

Referring to FIG. 5, a method is shown for producing a stable clock that has double the frequency of a primary clock. In the first step the primary clock is delayed through a delay circuit having a plurality of delay elements 90. The primary clock is compared to the delayed clock at the output of each delay element 91. A first delayed clock that is out of phase with the primary clock is determined, and a second delayed clock that is half the delay of the first delayed clock is selected 93. This second delayed clock is a quarter phase shifted clock from the primary clock and when combined with the primary clock in an XOR circuit 94 produces a double primary clock frequency at approximately a fifty percent duty cycle 95. A different duty cycle can be produced by selecting a different second delayed clock.

While the invention has been particularly shown and described with reference to preferred embodiments thereof, it will be understood by those skilled in the art that various changes in form and details may be made without departing from the spirit and scope of the invention.

What is claimed is:

1. A frequency multiplier circuit, comprising:

a) a primary clock connected to a single delay circuit containing a plurality of delay elements sequentially connected, b) a plurality of delayed clock signals from said plurality of delay elements connected to a plurality of exclusive OR circuits, c) said primary clock connected to said plurality of exclusive OR circuits, d) a plurality of delay detectors connected to said plurality of delayed clock signals, e) outputs of the plurality of delay detectors connected to a decoder to select an output of said exclusive OR circuits that produces a double clock frequency resulting from an exclusive OR of the primary clock and a second delayed clock signal having a delay that is a defined fraction of a first delayed clock signal that is selected to be out of phase with said primary clock.

2. The frequency multiplier circuit of claim 1, wherein each delay detector of the plurality of delay detectors is a latch with clock input of the latch connected to a delay element and data input of the latch connected to the primary clock.

3. The frequency multiplier circuit of claim 1, wherein said selected clock delay is a fraction of a detected delay where the primary clock and the detected delay are out of phase, and producing a first zero in the output of a delay detector of the plurality of delay detectors.

4. The frequency multiplier circuit of claim 1, wherein output signals of said decoder are latched to prevent propagation of erroneous signals.

5. A clock frequency multiplier circuit, comprising:

a) a means for delaying a primary clock along a sequential chain of delay elements, b) a means for detecting a first delayed primary clock that is out of phase with said primary clock along said sequential chain of delay elements, c) a means for selecting a second delayed primary clock along said sequential chain of delay elements that has a delay that is a defined fraction of said first delayed primary clock, d) a means for combining said primary clock and said second delayed primary clock to produce a signal having a double frequency of said primary clock at a defined duty cycle determined by said second delayed primary clock.

6. The clock frequency multiplier circuit of claim 5, wherein the means for selecting the delayed primary clock is determined by detecting when the primary clock and the delayed primary clock are out of phase.

7. The clock frequency multiplier circuit of claim 6, wherein the primary clock and the delayed primary clock are combined in an exclusive OR circuit to produce a frequency double of the primary clock.

8. A method for doubling a clock frequency, comprising:

a) delaying a primary clock through a plurality of delay elements sequentially connected, b) comparing the primary clock to a delayed clock at an output of each delay element of the plurality of delay elements, c) determining a first delayed clock that is out of phase with the primary clock, d) selecting a second delayed clock having a delay half the first delayed clock, e) combining the second delayed clock with the primary clock in an exclusive OR circuit to produce an output signal of double frequency of the primary clock at a fifty percent duty cycle.

9. The method of claim 8, wherein the primary clock is compared to a delayed clock using a latch, comprising:

a) connecting the primary clock to a data input of a latch, b) connecting the delayed clock to a clock input of the latch, c) an output of the latch producing a logical one until the delayed clock is out of phase with the primary clock, d) the output of the latch producing a logical zero after the delayed clock is out of phase with the primary clock, e) the output of the latch producing a first logical zero determining when the primary clock and the delayed clock are out of phase with each other.

10. The method of claim 8, wherein a duty cycle of the output signal of the exclusive OR circuit is double the frequency of the primary clock at a fifty percent duty cycle.

11. The method of claim 10, wherein the duty cycle of the output signal of the exclusive OR circuit can be changed by selecting the second delayed clock to have a delay different than half the first delayed clock.

* * * * *

UNITED STATES PATENT AND TRADEMARK OFFICE
CERTIFICATE OF CORRECTION

PATENT NO. : 6,008,676  
DATED : December 28, 1999  
INVENTOR(S) : Eng Han Lee, Yung Yan Ang Page 1 of 1

It is certified that error appears in the above-identified patent and that said Letters Patent is hereby corrected as shown below:

<u>Title page,</u>
Item [56], add -- 4,339,722  7/13/82   Sydor et al......328/38,
              5,436,939   7/25/95   Co et al.........375/376,
              5,321,734   6/14/94   Ogata............377/47 --
to the list of References Cited.

Signed and Sealed this

Twenty-seventh Day of November, 2001

Attest:

NICHOLAS P. GODICI  
Attesting Officer    *Acting Director of the United States Patent and Trademark Office*